(12) United States Patent
Kleihorst et al.

(10) Patent No.: US 7,279,898 B2
(45) Date of Patent: Oct. 9, 2007

(54) MRI RF SURFACE COIL WITH REDUCED SENSITIVITY IN PROXIMITY OF CONDUCTORS

(75) Inventors: Robert Paul Kleihorst, Eindhoven (NL); Jan Bertus Marten Warntjes, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 68 days.

(21) Appl. No.: 10/560,873

(22) PCT Filed: Jun. 21, 2004

(86) PCT No.: PCT/IB2004/050938

§ 371 (c)(1),
(2), (4) Date: Dec. 14, 2005

(87) PCT Pub. No.: WO2004/113945

PCT Pub. Date: Dec. 29, 2004

(65) Prior Publication Data

US 2007/0096736 A1  May 3, 2007

(30) Foreign Application Priority Data

Jun. 24, 2003 (EP) .................................. 03101856

(51) Int. Cl.
*G01V 3/00* (2006.01)
(52) U.S. Cl. ...................................... 324/318; 600/422
(58) Field of Classification Search ................ 324/318, 324/322; 600/422
See application file for complete search history.

(56) References Cited

U.S. PATENT DOCUMENTS 5,453,692 A   9/1995  Takahashi et al. .......... 324/318
5,585,721 A * 12/1996  Datsikas ..................... 324/318
5,592,088 A   1/1997  Matsunaga et al. ......... 324/318
6,008,649 A  12/1999  Boskamp et al. ........... 324/318
6,404,201 B1  6/2002  Boskamp .................... 324/318

FOREIGN PATENT DOCUMENTS

EP   0 274 773 A1   7/1988

(Continued)

Primary Examiner—Louis M. Arana

(57) ABSTRACT

The invention relates to a radio-frequent (RF) coil system (17, 17') for use in a magnetic resonance imaging (MRI) system. The RF coil system comprises at least one main coil (35) for transmitting an RF magnetic field ($B_1$) into and/or receiving an RF magnetic field ($B_1'$) from an examination volume (3) of the MRI system. The main coil has a main coil axis (37), which is or is to be oriented parallel to a main magnetic field ($B_0$) in the examination volume, and at least one electrical conductor (39, 41) which extends mainly parallel to the main coil axis. According to the invention, the RF coil system comprises at least two electrical auxiliary coils (51, 53, 55, 57) which are assigned to said conductor of the main coil. The auxiliary coils are arranged on opposite sides of said conductor of the main coil. Each auxiliary coil has a coil axis (59, 61, 63, 65) which extends substantially parallel to the main coil axis at a distance from the conductor of the main coil to which the respective auxiliary coil is assigned, said distance being small relative to a main dimension (L) of the main coil. The auxiliary coils constitute passive electrical coils in which electrical currents are generated under the influence of an RF magnetic field ($B_{11}$, $B_{11}'$) present at the location of the auxiliary coils. The RF magnetic field ($B_{12}$, $B_{34}$) generated by the auxiliary coils as a result of said currents in the auxiliary coils suppresses said RF magnetic field present at the location of the auxiliary coils. Thus, the auxiliary coils provide a sensitivity reducing effect of the RF coil system in local regions (47, 49) which are at relatively small distances from the conductor of the main coil. For regions at a distance from the conductor of the main coil comparable to the main dimension of the main coil, said sensitivity reducing effect is negligible.

7 Claims, 3 Drawing Sheets

FOREIGN PATENT DOCUMENTS

Figure 1:
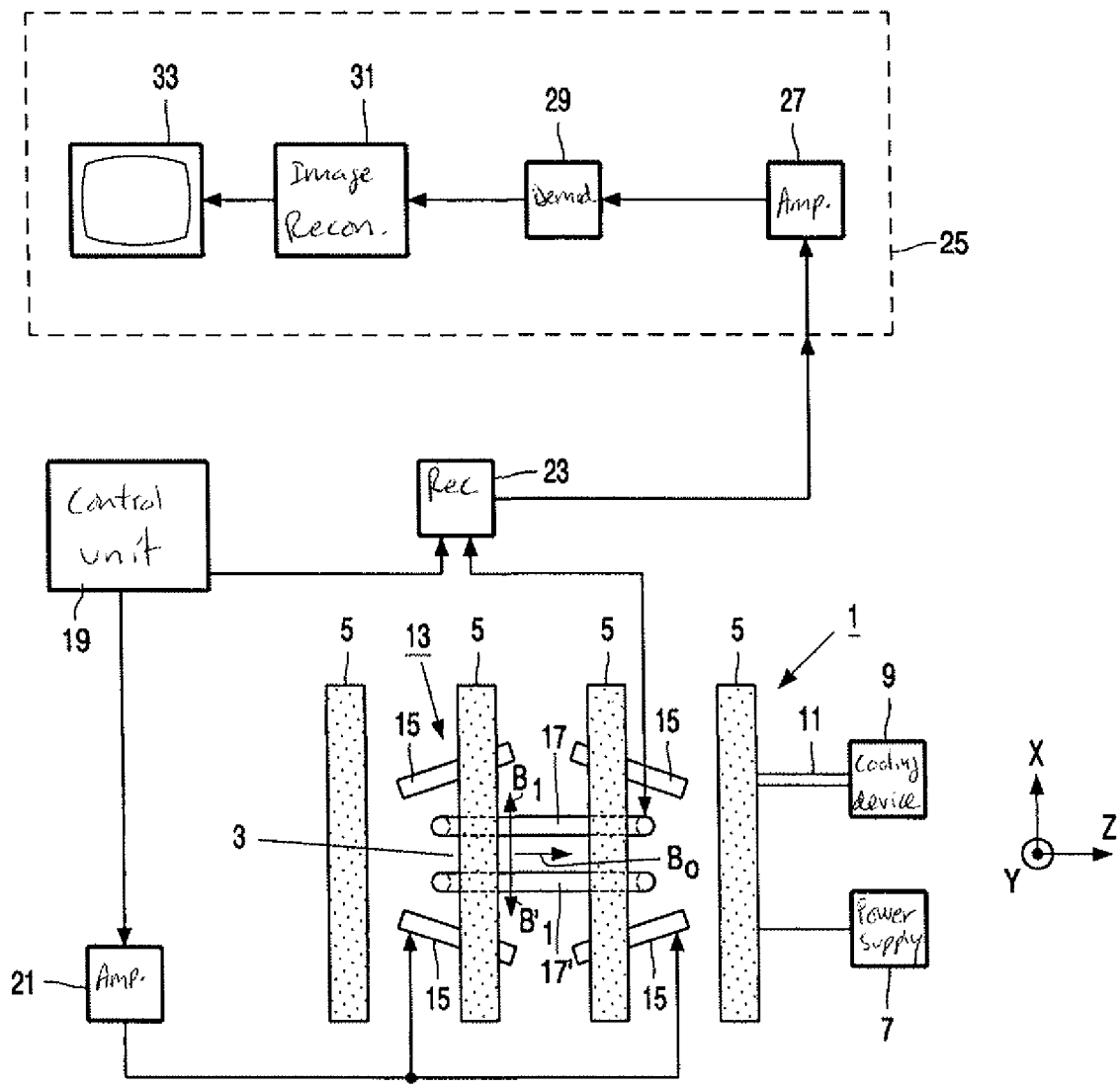

| GB | 2 266 775 A | 11/1993 |
| JP | 07-313483 | 5/1995 |
| JP | 07 255700 | 10/1995 |
| JP | 09 187437 | 7/1997 |

* cited by examiner

MRI RF SURFACE COIL WITH REDUCED SENSITIVITY IN PROXIMITY OF CONDUCTORS

The invention relates to a radio-frequent (RF) coil system for use in a magnetic resonance imaging (MRI) system, comprising at least one electrical main coil for transmitting an RF magnetic field into an examination volume of the MRI system and/or receiving an RF magnetic field from the examination volume, said main coil having a main coil axis which is to be oriented substantially parallel to a main magnetic field of the MRI system in the examination volume, said main coil having at least one electrical conductor extending mainly parallel to the main coil axis.

The invention further relates to a magnetic resonance imaging (MRI) system comprising an examination volume, a main magnet system for generating a main magnetic field in the examination volume, a gradient magnet system for generating gradients of the main magnetic field, and an RF coil system for transmitting an RF magnetic field into the examination volume and/or receiving an RF magnetic field from the examination volume.

A radio-frequent (RF) coil system and a magnetic resonance imaging (MRI) system of the kinds mentioned in the opening paragraphs are generally known. The known MRI system is used to make images of the entrails of a patient's body by means of a nuclear spin resonance method. The main magnet system of the MRI system comprises a number of superconducting electrical coils for generating a relatively strong and uniform main magnetic field within a central region of the examination volume. The gradient magnet system comprises a number of electrical coils for generating gradients of the main magnetic field in three orthogonal directions. The known MRI system further comprises a first RF coil system for transmitting an RF magnetic field into the examination volume and a second RF coil system for receiving an RF magnetic field from the examination volume. It is also known to use a single RF coil system for transmission and receiving purposes. An image of the patient's body is constructed by observing nuclear spin resonance effects in a large number of positions in the patient's body, which are selected by altering said gradients. For each selected position, the first RF coil system transmits an RF magnetic field into the examination volume in order to generate nuclear spin resonance effects in the selected position. Subsequently, the second RF coil system receives an RF magnetic field which is generated in the selected position as a result of the nuclear spin resonance effects.

A disadvantage of the known RF coil system and of the known MRI system comprising the known RF coil system is that the RF coil system has a relatively high local sensitivity for regions of the patient's body which are relatively close to the individual electrical conductors of the RF coil system oriented mainly parallel to the main magnetic field, i.e. for local regions at a distance from said conductors which is small relative to a main dimension of the main coil In the case of a transmitting RF coil system, said high local sensitivity is caused by the fact that, in positions relatively close to the conductors, the magnetic field generated by the RF coil system is relatively strong. In the case of a receiving RF coil system, said high local sensitivity is caused by the fact that, at the location of the conductors, the magnetic field generated by the nuclei in positions relatively close to the conductors is relatively strong. In particular, said high local sensitivity is present in the case of a so-called surface coil system, i.e. an RF coil system which is placed directly on the patient's body to achieve an improved signal-to-noise ratio.

As a result of said high local sensitivity, known MRI systems using surface coil systems are highly susceptible to movement artifacts in the generated image, which are caused by relatively strong signals generated at the surface of the patient, for example in the subcutaneous fat layers on the patient's chest or belly.

An object of the invention is to provide a radio-frequent (RF) coil system of the kind mentioned in the opening paragraphs and a magnetic resonance imaging (MRI) system of the kind mentioned in the opening paragraphs, in which said local high sensitivity of the RF coil system is reduced without substantially affecting the sensitivity of the RF coil system for positions which are not relatively close to the conductors of the RF coil system.

In order to achieve said object, an RF coil system in accordance with the invention is characterized in that the RF coil system comprises at least two electrical auxiliary coils assigned to said conductor of the main coil and arranged on opposite sides of said conductor of the main coil, each auxiliary coil having a coil axis extending substantially parallel to the main coil axis at a distance from said conductor of the main coil, wherein said distance is small relative to a main dimension of the main coil.

In order to achieve said object, an MRI system in accordance with the invention is characterized in that the RF coil system used therein is an RF coil system in accordance with the invention.

The auxiliary coils assigned to the conductor of the main coil are passive electrical coils in which electrical currents are induced under the influence of an alternating magnetic field present at the location of the auxiliary coils. In a transmitting mode of the RF coil system according to the invention, electrical currents are induced in the auxiliary coils predominantly under the influence of the RF magnetic field generated by the conductor of the main coil to which the auxiliary coils are assigned. In this mode, the electrical currents in the auxiliary coils cause an RF magnetic field of the auxiliary coils which opposes the RF magnetic field generated by said conductor of the main coil. Since the auxiliary coils are present on opposite sides of said conductor of the main coil and the coil axes of the auxiliary coils are at relatively small distances from said conductor, the RF magnetic field of the auxiliary coils is relatively small in positions at distances from said conductor of the main coil comparable to the main dimension of the main coil. As a result, said opposing effect of the RF magnetic field of the auxiliary coils is predominantly present in a local region at a distance from said conductor of the main coil which is small relative to the main dimension of the main coil, i.e. in a local region where the main coil would have a relatively high local sensitivity without the presence of the auxiliary coils. In positions at distances from said conductor of the main coil comparable to the main dimension of the main coil, the RF magnetic field of said conductor of the main coil is hardly affected by the RF magnetic field of the auxiliary coils.

In a receiving mode of the RF coil system according to the invention, electrical currents are induced in the auxiliary coils under the influence of the RF magnetic field generated by spinning nuclei. In this mode, the electrical currents in the auxiliary coils cause an RF magnetic field which opposes the RF magnetic field generated by the spinning nuclei. Since the auxiliary coils are present on opposite sides of the conductor of the main coil, to which the auxiliary coils are assigned, and the coil axes of the auxiliary coils are at relatively small distances from said conductor, the auxiliary coils are predominantly sensitive to the RF magnetic field which is generated by spinning nuclei present in positions at relatively small distances from said conductor of the main coil. As a result, said opposing effect of the RF magnetic field of the auxiliary coils is predominantly present in a local region at a distance from said conductor of the main coil which is small relative to the main dimension of the main coil, i.e. in a local region where the main coil would have a relatively high local sensitivity without the presence of the auxiliary coils. The spinning nuclei in positions at distances from said conductor of the main coil comparable to the main dimension of the main coil hardly generate electrical currents in the auxiliary coils, so that the sensitivity of said conductor of the main coil for these positions is hardly affected by the auxiliary coils.

A particular embodiment of an RF coil system according to the invention is characterized in that the main coil has a loop comprising a first and a second electrical conductor extending mainly parallel to the main coil axis, the RF coil system having a first and a second auxiliary coil assigned to said first conductor and arranged on opposite sides of said first conductor and a third and a fourth auxiliary coil assigned to said second conductor and arranged on opposite sides of said second conductor, each auxiliary coil having a coil axis extending substantially parallel to the main coil axis at a distance from the respective conductor of the main coil to which the respective auxiliary coil is assigned, wherein said distance is small relative to said main dimension. In this particular embodiment, the main coil is for example a square or rectangular coil. The local high sensitivity of the main coil for the region, which is relatively close to said first conductor of the main coil, is effectively reduced by means of said first and said second auxiliary coil, while the local high sensitivity of the main coil for the region, which is relatively close to said second conductor of the main coil, is effectively reduced by means of said third and said fourth auxiliary coil.

A particular embodiment of an RF coil system according to the invention is characterized in that the two auxiliary coils are connected in series in an electrical anti-phase mode. In this particular embodiment, the electrical anti-phase mode of the two auxiliary coils is for example achieved by means of a so-called butterfly-loop connection or symbol-8 shaped loop connection between the two auxiliary coils. As a result of the fact that the two auxiliary coils are connected in series, the electrical currents in the two auxiliary coils are equal. An advantage of this embodiment is that, in a design phase of the RF coil system, the magnetic field of the two auxiliary coils can be optimized by optimizing the dimensions and the surface areas of the two auxiliary coils.

A particular embodiment of an RF coil system according to the invention is characterized in that the conductor of the main coil extends substantially parallel to the main coil axis, and each auxiliary coil comprises two conductors extending substantially parallel to the main coil axis, wherein the distance between the coil axis of each auxiliary coil and the conductor of the main coil is larger than $0.5*B$ and smaller than $1.5*B$, B being a distance between the two conductors of the respective auxiliary coil. In this embodiment, said distance between the coil axis of each auxiliary coil and the conductor of the main coil, to which the auxiliary coils are assigned, is sufficiently small to achieve the desired local sensitivity reducing effect of the auxiliary coils.

A further embodiment of an RF coil system according to the invention is characterized in that the first and the second conductor of the main coil extend substantially parallel to the main coil axis, and each auxiliary coil comprises two conductors extending substantially parallel to the main coil axis, wherein a distance B between the two conductors of each auxiliary coil is larger than $0.06*L$ and smaller than $0.25*L$, L being a distance between the first and the second conductor of the main coil. In this embodiment, said distance B between the two conductors of each auxiliary coil is sufficiently small relative to a main dimension of the main coil, i.e. relative to the distance L between the first and the second conductor of the main coil, to achieve the desired local sensitivity reducing effect of the auxiliary coils.

A further embodiment of an RF coil system according to the invention is characterized in that the RF coil system comprises a skin contact surface, the first and the second conductor of the main coil extending in an imaginary plane at a distance D from said skin contact surface, and each auxiliary coil extending in an imaginary plane at a distance H from said skin contact surface, wherein $0<H<3*D$. In this embodiment, a distance H-D is present between the imaginary plane, in which the auxiliary coils extend, and the imaginary plane in which the main coil extends. With the condition $0<H<3*D$, the distance between the conductors of the auxiliary coils and the conductors of the main coil is sufficiently small relative to a main dimension of the main coil to achieve the desired local sensitivity reducing effect of the auxiliary coils.

A yet further embodiment of an RF coil system according to the invention is characterized in that $D<H<1.5*D$. In this embodiment, an optimum dimension is achieved of the regions, relatively close to the first and the second conductor of the main coil, for which the local high sensitivity of the main coil is effectively reduced by means of the auxiliary coils.

Figure 2A:
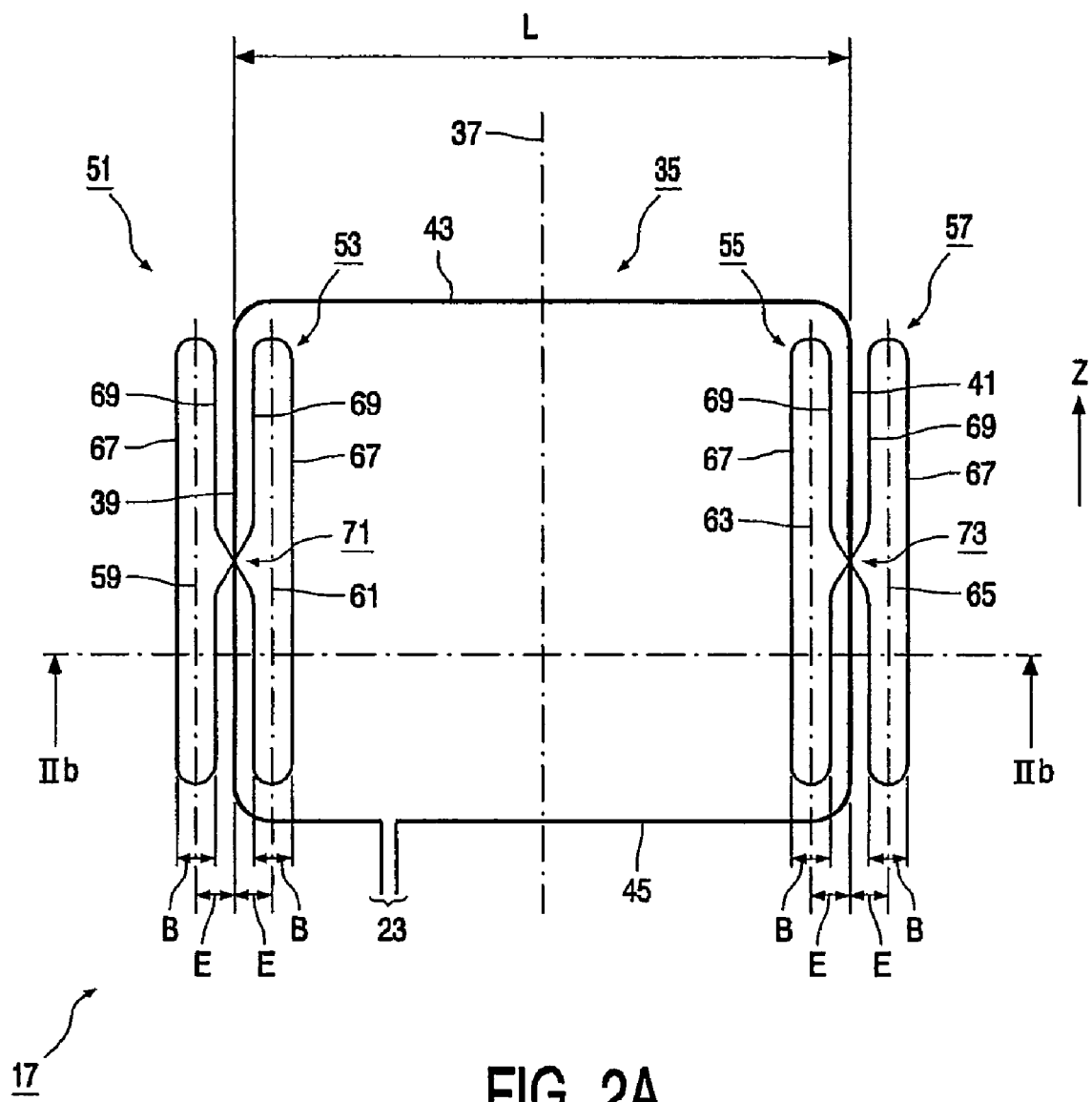
Figure 2B:
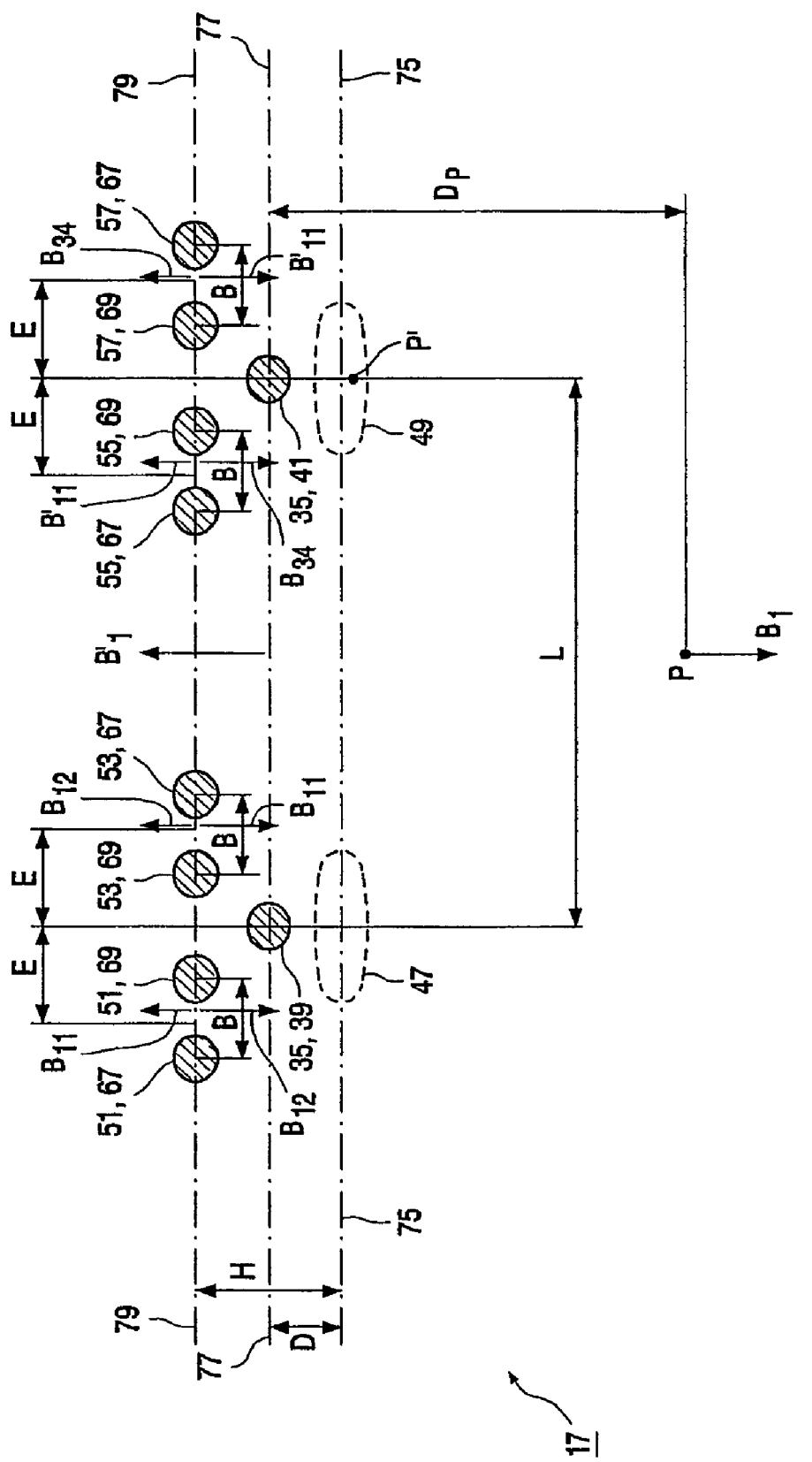

In the following, embodiments of the invention will be described in detail with reference to the figures, in which FIG. 1 diagrammatically shows a magnetic resonance imaging (MRI) system in accordance with the invention comprising a radio-frequent (RF) coil system in accordance with the invention, FIG. 2a diagrammatically shows a portion of the RF coil system of the MRI system of FIG. 1, and FIG. 2b shows a cross-section along the line IIb-IIb in FIG. 2a.

The MRI system in accordance with the invention shown in FIG. 1 is an MRI system of the so-called closed cylindrical type comprising a mainly cylindrical housing, which is not shown in FIG. 1 and extends in a Z-direction indicated in FIG. 1. The MRI system comprises a main magnet system 1, which is enclosed by said housing and which surrounds an examination volume 3 in which a patient to be examined can be positioned. The main magnet system 1 comprises a number of superconducting electrical coils 5 for generating a relatively strong and substantially uniform main magnetic field $B_0$ parallel to the Z-direction in a central portion of the examination volume 3. The MRI system comprises an electrical power supply 7 for the superconducting coils 5 and a cryogenic cooling device 9 with cooling channels 11 for cooling the superconducting coils 5. The MRI system further comprises a gradient magnet system 13, which is arranged between the main magnet system 1 and the examination volume 3 and comprises a number of electrical coils 15 for generating gradients of the main magnetic field $B_0$ in three orthogonal directions X, Y, and Z. The MRI system further comprises a radio-frequent (RF) coil system 17, 17' in accordance with the invention, which is arranged between the gradient magnet system 13 and the examination volume 3 for transmitting an RF magnetic field into the examination volume 3 and for receiving an RF magnetic field from the examination volume 3.

The MRI system is used to make images of the entrails of a patient's body by means of a nuclear spin resonance method. An image of the patient's body is constructed by successively observing nuclear spin resonance effects in a large number of positions in a portion of the patient's body which is present in the uniform main magnetic field $B_0$. The positions in the patient's body are successively selected by altering the gradients of the main magnetic field $B_0$ by means of suitable currents in the electrical coils 15 of the gradient magnet system 13. For this purpose, the MRI system comprises a control unit 19, which controls the currents in the coils 15 of the gradient magnet system 13 in accordance with a predetermined sequence, and a power amplifier 21 for amplifying the control signals supplied by the control unit 19 to the coils 15 of the gradient magnet system 13. For each selected position in the patient's body, the RF coil system 17, 17' transmits an RF magnetic field with a predetermined frequency and pulse time into the examination volume 3 in order to generate nuclear spin resonance effects in the selected position. Subsequently, the RF coil system 17, 17' is used to receive an RF magnetic field which is generated by the spinning nuclei in the selected position in connection with the nuclear spin resonance effects. For this purpose, the control unit 19 also controls the RF coil system 17, 17' in accordance with a predetermined sequence which is linked up with the sequence according to which the gradient magnet system 13 is controlled. The control unit 19 supplies a control signal to an RF transmitting and receiving device 23, which feeds the RF coil system 17, 17' with a suitable current in order to generate the required RF magnetic field in the examination volume 3. The RF transmitting and receiving device 23 also receives a current from the RF coil system 17, 17' generated in the RF coil system 17, 17' by the RF magnetic field from the examination volume 3. The RF transmitting and receiving device 23 supplies a signal to a processor 25 of the MRI system, which is suitable for converting the signals received from the RF transmitting and receiving device 23 into an image. For this purpose, the processor 25 comprises a signal amplifier 27, a demodulator 29, an image reconstruction device 31, and a display 33.

The nuclear spin resonance effects to be generated by means of the RF coil system 17, 17' comprise a precession of the spin axes of the spinning nuclei in a predetermined direction of precession along an imaginary conical surface having a central axis parallel to the Z-direction of the main magnetic field $B_0$. Consequently, the component $B_1$, of the RF magnetic field generated by the RF coil system 17, 17', which is directed perpendicularly to the Z-direction (hereinafter called the RF magnetic field $B_1$), is predominantly effective in generating the nuclear spin resonance effects. The component $B_1$, is predominantly generated by conducting portions of the RF coil system 17, 17' which extend parallel to the Z-direction. The RF magnetic field $B_1'$, which is generated by the spinning nuclei in connection with the nuclear spin resonance effects and which is to be received by the RF coil system 17, 17', is also directed perpendicularly to the Z-direction. Consequently, the conducting portions of the RF coil system 17, 17', which extend parallel to the Z-direction, are predominantly sensitive to the RF magnetic field $B_1'$. FIGS. 2a and 2b diagrammatically show a portion 17 of the RF coil system 17, 17' comprising an electrical main coil 35. The main coil 35 has a coil axis 37 which is or is to be oriented substantially parallel to the Z-direction of the main magnetic field $B_0$. The main coil 35 has a loop comprising a first electrical conductor 39 and a second electrical conductor 41, which extend substantially parallel to the coil axis 37 and accordingly form the predominantly effective and sensitive portions of the main coil 35. The loop further comprises further electrical conductors 43 and 45, which extend substantially perpendicularly to the coil axis 37 and accordingly form portions of the main coil 35 having only a minor effectiveness and sensitivity. In the transmitting mode, an alternating electrical current in said loop results in an RF magnetic field $B_1$, as shown in FIG. 2b, in a selected position P in the patient's body at a distance $D_P$ from the loop. In the receiving mode, an RF magnetic field $B_1'$, shown in FIG. 2b and generated at the location of the loop in connection with nuclear magnetic resonance effects in said selected position P, results in an alternating electrical current induced in said loop.

In the transmitting mode, the strength of the RF magnetic field $B_1$, generated by the first and the second conductor 39, 41 in the selected position P strongly depends on the distance between the selected position P and the conductors 39, 41. In local regions 47, 49 in the patient's body present at a distance from the conductors 39 and 41 which is small relative to a main dimension of the main coil 35, e.g. the distance L between the two conductors 39, 41, the generated RF magnetic field $B_1$, is relatively strong, so that the main coil 35 has a local high effectiveness for said local regions 47, 49. Similarly, in the receiving mode, a relatively strong current is induced in the first and the second conductor 39, 41 under the influence of an RF magnetic field $B_1'$ generated in connection with nuclear magnetic resonance effects in positions which are within said local regions 47, 49. As a result, in the receiving mode, the main coil 35 has a local high sensitivity for said local regions 47, 49. In particular, said local high sensitivity becomes manifest in embodiments wherein the RF coil system 17, 17' is used as a so-called surface coil In such embodiments, the RF coil system 17, 17' is placed directly on the patient's body to achieve an improved effectiveness and sensitivity and an improved signal-to-noise ratio for regions deep in the patient's body. However, it appeared that in such embodiments the local high sensitivity for the local regions 47, 49 present at relatively small distances from the conductors 39, 41 causes the generated images to be highly susceptible to movement artifacts, which are caused by relatively high signals generated at the surface of the patient's body, for example in the subcutaneous fat layers on the patient's chest or belly.

In order to reduce the above described local high sensitivity of the main coil 35 for the local regions 47, 49, present at relatively small distances from the first and the second conductor 39, 41, without affecting the effectiveness and the sensitivity of the main coil 35 for selected positions outside said local regions 47, 49, i.e. for positions at a distance from said conductors 39, 41 in the order of the main dimension L of the main coil 35, the portion 17 of the RF coil system 17, 17' in accordance with the invention comprises a first electrical auxiliary coil 51 and a second electrical auxiliary coil 53, which are assigned to and associated with the first conductor 39 of the main coil 35, and a third electrical auxiliary coil 55 and a fourth electrical auxiliary coil 57, which are assigned to and associated with the second conductor 41 of the main coil 35, as shown in FIG. 2a. The first and the second auxiliary coil 51, 53 are arranged on opposite sides of the first conductor 39 of the main coil 35 and each have a coil axis 59, 61 extending parallel to the main coil axis 37 at a distance E from said first conductor 39, said distance E being small relative to the main dimension L of the main coil 35. The third and the fourth auxiliary coil 55, 57 are arranged on opposite sides of the second conductor 41 of the main coil 35 and each have a coil axis 63, 65 extending substantially parallel to the main coil axis 37 at said distance E from said second conductor 41. Each auxiliary coil 51, 53, 55, 57 has two electrical conductors 67, 69, which extend parallel to the main coil axis 37 over substantially the complete length of the respective conductor 39, 41 to which the respective auxiliary coil 51, 53, 55, 57 is assigned, wherein a distance B is present between said two conductors 67, 69 of each auxiliary coil 51, 53, 55, 57 which is small relative to the main dimension L of the main coil 35. In the embodiment shown in FIGS. 2a and 2b, the first and the second auxiliary coil 51, 53 are electrically connected in series and the third and the fourth auxiliary coil 55, 57 are also electrically connected in series. In this embodiment it is necessary that the first and the second auxiliary coil 51, 53 are electrically connected in anti-phase mode, which is achieved by means of a so-called butterfly-loop connection or symbol-8 shaped loop connection 71 between the first and the second auxiliary coils 51, 53, as shown in FIG. 2a. As a result, the electrical currents in the first and the second auxiliary coils 51, 53 have mutually opposite directions. Likewise, a butterfly-loop connection 73 is present between the third and the fourth auxiliary coil 55, 57.

In the following, the technical effect of the presence of the auxiliary coils 51, 53, 55, 57 will be explained. The auxiliary coils 51, 53, 55, 57 constitute passive electrical coils, in which electrical currents are induced as a result of a variation of the magnetic field present at the location of the auxiliary coils 51, 53, 55, 57. For the transmitting mode of the RF coil system 17, 17', the technical effect will be explained with reference to the first and the second auxiliary coil 51, 53, and the skilled person will understand that the technical effect of the third and the fourth auxiliary coil 55, 57 will be similar. In the transmitting mode of the RF coil system 17, 17', the electrical currents in the first and the second auxiliary coil 51, 53 are predominantly induced under the influence of variations of the RF magnetic field $B_{11}$ generated by the first conductor 39 of the main coil 35 at the location of the first and the second auxiliary coil 51, 53. As schematically shown in FIG. 2b, said RF magnetic field $B_{11}$ has mainly opposite directions at the location of the first and the second auxiliary coil 51, 53, so that the electrical currents induced in the first and the second auxiliary coil 51, 53 also have opposite directions, which are allowed as a result of the butterfly-loop connection 71. The electrical currents induced in the first and the second auxiliary coil 51, 53 will generate an RF magnetic field $B_{12}$, schematically shown in FIG. 2b, which is opposite to the RF magnetic field $B_{11}$ and consequently suppresses the RF magnetic field $B_{11}$. Since the coil axes 59, 61 and the conductors 67, 69 of the first and the second auxiliary coil 51, 53 are arranged at distances from the first conductor 39 of the main coil 35 which are small relative to the main dimension L of the main coil 35, the RF magnetic field $B_{12}$ is relatively small in positions at distances from said first conductor 39 which are comparable to said main dimension L. Consequently, the first and the second auxiliary coil 51, 53 predominantly oppose the RF magnetic field $B_{11}$ of the first conductor 39 in positions at distances from the first conductor 39 which are small relative to the main dimension L, such as the local region 47 in the patient's body close to the first conductor 39 for which the main coil 35 would have a relatively high local sensitivity without the presence of the first and the second auxiliary coil 51, 53. In positions at distances from the first conductor 39 comparable to the main dimension L, the RF magnetic field $B_1$ of the main coil 35 and the sensitivity of the main coil 35 are hardly affected by the presence of the first and the second auxiliary coil 51, 53.

For the receiving mode of the RF coil system 17, 17', the technical effect of the auxiliary coils 51, 53, 55, 57 will be explained with reference to the third and the fourth auxiliary coil 55, 57, and the skilled person will understand that the technical effect of the first and the second auxiliary coil 51, 53 will be similar. In the receiving mode of the RF coil system 17, 17', electrical currents in the third and the fourth auxiliary coil 55, 57 are induced under the influence of variations of the RF magnetic field generated by the spinning nuclei. FIG. 2b schematically shows the RF magnetic field $B_{11}'$ generated at the location of the third, and the fourth auxiliary coil 55, 57 by the spinning nuclei in a position P' in the local region 49. Said RF magnetic field $B_{11}'$ has mainly opposite directions at the location of the third and the fourth auxiliary coil 55, 57, so that the electrical currents induced in the third and the fourth auxiliary coil 55, 57 also have opposite directions, which are allowed as a result of the butterfly-loop connection 73. The electrical currents induced in the third and the fourth auxiliary coil 55, 57 will generate an RF magnetic field $B_{34}$, schematically shown in FIG. 2b, which is opposite to the RF magnetic field $B_{11}'$ and consequently suppresses the RF magnetic field $B_{11}'$. Since the coil axes 63, 65 and the conductors 67, 69 of the third and the fourth auxiliary coil 55, 57 are arranged at distances from the second conductor 41 of the main coil 35 which are small relative to the main dimension L of the main coil 35, the spinning nuclei in positions at distances from the second conductor 41, which are comparable to the main dimension L, will generate mainly equally directed RF magnetic fields at the locations of the third and the fourth auxiliary coil 55, 57. As a result of the butterfly-loop connection 73, the electrical currents in the third and the fourth auxiliary coil 55, 57 induced by the latter RF magnetic fields will be relatively small or even zero, so that the latter RF magnetic fields are hardly or not suppressed by the presence of the third and the fourth auxiliary coil 55, 57. Consequently, the third and the fourth auxiliary coil 55, 57 predominantly suppress the RF magnetic field generated by the spinning nuclei in positions at distances from the second conductor 41 which are small relative to the main dimension L, in particular by the spinning nuclei in the local region 49 for which the main coil 35 would have a relatively high local sensitivity without the presence of the third and the fourth auxiliary coil 55, 57. For positions at distances from the second conductor 41 comparable to the main dimension L, the sensitivity of the main coil 35 is hardly affected by the presence of the third and the fourth auxiliary coil 55, 57.

In the foregoing it is disclosed that, in order to obtain a reduction of the sensitivity of the main coil 35 which is limited to local regions at a distance from the first and the second conductor 39, 41 which is small relative to the main dimension L of the main coil 35, the auxiliary coils 51 and 53 should be arranged on opposite sides of the first conductor 39, and the auxiliary coils 55 and 57 should be arranged on opposite sides of the second conductor 41, while the coil axes 59, 61, 63, 65 of the auxiliary coils 51, 53, 55, 57 should be at a distance E from the respective conductor 39, 41 of the main coil 35 which is small relative to said main dimension L. Preferably the distance B between the conductors 67, 69 of each auxiliary coil 51, 53, 55, 57 is also small relative to said main dimension L. It is noted that, in this respect, the expression "on opposite sides of" intends to indicate that the respective two auxiliary coils 51, 53 and 55, 57 must be arranged on opposite sides of an imaginary plane, which extends through the respective conductor 39, 41 of the main coil 35 and is oriented perpendicularly to the imaginary plane in which the main coil 35 extends. It was found that, in the embodiment shown in FIGS. 2a and 2b, a sufficient local sensitivity reducing effect of the auxiliary coils 51, 53, 55, 57 is obtained if said distance E is smaller than 1,5*B and larger than 0,5*B. In order to obtain a sufficient local sensitivity reducing effect of the auxiliary coils 51, 53, 55, 57, the distance B between the conductors 67, 69 of the auxiliary coils 51, 53, 55, 57 should be smaller than 0,25*L and larger than 0,06*L. In an embodiment wherein the RF coil system 17, 17' is used as a surface coil, an optimum range can also be defined for the distance between the auxiliary coils 51, 53, 55, 57 and a skin contact surface of the RF coil system 17, 17'. FIG. 2b schematically shows the position of a skin contact surface 75 of the RF coil system 17, 17', i.e. a surface via which the RF coil system 17, 17' is in contact with the patient's skin during operation. As shown in FIG. 2b, a distance D is present between the skin contact surface 75 and an imaginary plane 77 in which the first and the second conductors 39, 41 of the main coil 35 extend, and a distance H is present between the skin contact surface 75 and an imaginary plane 79 in which the auxiliary coils 51, 53, 55, 57 extend. It was found that, if said distance H is within the range between 0 and 3*D, the distance between the conductors 67, 69 of the auxiliary coils 51, 53, 55, 57 and the conductors 39, 41 of the main coil 35 is sufficiently small to achieve a sufficient local sensitivity reducing effect of the auxiliary coils 51, 53, 55, 57. Preferably, said distance H is larger than the distance D, i.e. the auxiliary coils 51, 53, 55, 57 are arranged at a side of the main coil 35 which is remote from the skin contact surface 75. An optimum dimension of the local regions 47, 49, for which the desired sensitivity reducing effect is achieved, is obtained if said distance H is between D and 1,5*D. It is noted that it is not essential that the respective two auxiliary coils 51, 53 and 55, 57 extend in a common imaginary plane, as is the case in the embodiment shown in FIGS. 2a and 2b. The invention also encloses embodiments in which the two auxiliary coils assigned to a conductor of the main coil are arranged on opposite sides of said conductor and in different imaginary planes which each enclose an acute angle with the skin contact surface 75.

In the embodiment shown in FIGS. 2a and 2b, the auxiliary coils 51, 53 and the auxiliary coils 55, 57 are symmetrically arranged relative to the respective conductor 39, 41 of the main coil 35. It is noted, however, that the invention also encloses embodiments in which the auxiliary coils 51, 53 and the auxiliary coils 55, 57 are asymmetrically arranged relative to the respective conductor 39, 41. The invention encloses embodiments in which, for example, the coil axes 59, 61, 63, 65 of the auxiliary coils 51, 53, 55, 57 are arranged at mutually different distances from the respective conductor 39, 41, and embodiments in which the auxiliary coils 51, 53, 55, 57 have mutually different shapes and/or dimensions. In embodiments wherein the auxiliary coils 51, 53, 55, 57 have mutually different shapes and/or dimensions, the auxiliary coils preferably have substantially equal surface area's, but this is not essential for a proper function of the auxiliary coils 51, 53, 55, 57.

In the embodiment shown in FIGS. 2a and 2b, the auxiliary coils 51, 53 and the auxiliary coils 55, 57 are connected in series in an electrical anti-phase mode by means of the butterfly-loop connections 71, 73. It is noted that said connection between the auxiliary coils 51, 53 and between the auxiliary coils 55, 57 is not an essential feature of the invention, and that the invention accordingly also encloses embodiments in which the two auxiliary coils 51, 53 and the two auxiliary coils 55, 57 each constitute a separate passive electrical loop. An advantage of connecting the two auxiliary coils 51, 53 and the two auxiliary coils 55, 57 in series and in anti-phase mode is that the electrical currents in the two auxiliary coils 51, 53 and in the two auxiliary coils 55, 57 are equal, so that, in a design phase of the RF coil system 17, 17', the magnetic field of the auxiliary coils 51, 53, 55, 57 can be optimized by optimizing the dimensions and the shape of the auxiliary coils 51, 53, 55, 57. The invention also encloses embodiments in which the auxiliary coils 51, 53, 55, 57 are connected in series and in anti-phase mode by means of connections which are different from the butterfly-loop connections 71, 73. Referring to FIG. 2a, the invention for example encloses an embodiment in which the conductors 69 of the first and the second auxiliary coil 51, 53 together constitute a single conductor which is common to the first and the second auxiliary coil 51, 53, and in which the conductors 69 of the third and the fourth auxiliary coil 55, 57 together constitute a single conductor which is common to the third and the fourth auxiliary coil 51, 53.

It is noted that the invention also encloses RF coil systems which have a coil configuration which is different from the coil configuration of the RF coil system 17, 17' shown in FIGS. 2a and 2b. For example, the invention also encloses RF coil systems having more than one main coil. Particularly, an RF coil system in accordance with the invention may be provided with a number of main coils which are arranged in mutually transversely oriented planes so as to improve the efficiency of generating and/or the sensitivity of receiving a rotating RF magnetic field in the examination volume. In such an embodiment, the conductors of each main coil oriented parallel to the main magnetic field $B_0$ may be provided with separate auxiliary coils. It is further noted that, in order to be effective, an RF coil system in accordance with the invention should be provided with at least one conductor which is or is to be oriented mainly parallel to the main magnetic field $B_0$. However, such a conductor does not need to be a straight conductor extending parallel to the main magnetic field $B_0$, like the first and the second conductor 39, 41 in the embodiment shown in FIGS. 2a and 2b. The conductor may, for example, also be a curved conductor having a main or predominant orientation parallel to the main magnetic field $B_0$. Accordingly, the expression "said main coil having at least one electrical conductor extending mainly parallel to the main coil axis" in the claims is to be interpreted in accordance herewith Accordingly, also the expression "the main coil has a loop comprising a first and a second electrical conductor extending mainly parallel to the main coil axis" in the claims is to be interpreted in the same manner.

The MRI system in accordance with the invention described before is an MRI system of the so-called closed cylindrical type. It is noted that the invention also encloses other types of MRI systems. An example is an MRI system of the so-called open type, in which the main magnet system and the gradient magnet system have been arranged in two separate housing portions at a distance from each other and in which the examination volume is an open volume present between said two housing portions.

The RF coil system 17, 17' in accordance with the invention described before has both a transmitting and a receiving function. It is noted that the invention also encloses RF coil systems which only have a receiving function and RF coil systems which only have a transmitting function. In particular, RF coil systems in accordance with the invention, which are used as a surface coil, may only have a receiving function so as to co-operate with a further RF coil system, which is in a fixed position relative to the main magnet system of the MRI system and which has only a transmitting function or a combined transmitting and receiving function.

The invention claimed is:

1. A radio-frequent coil system for use in a magnetic resonance imaging system, comprising at least one electrical main coil for transmitting an RF magnetic field into an examination volume of the MRI system and/or receiving an RF magnetic field from the examination volume, said main coil having a main coil axis which is to be oriented substantially parallel to a main magnetic field of the MRI system in the examination volume, said main coil having at least one electrical conductor extending mainly parallel to the main coil axis, wherein the RF coil system comprises at least two electrical auxiliary coils assigned to said conductor of the main coil and arranged on opposite sides of said conductor of the main coil, each auxiliary coil having a coil axis extending substantially parallel to the main coil axis at a distance from said conductor of the main coil, wherein said distance is small relative to a main dimension of the main coil, wherein the two auxiliary coils are connected in series in an electrical anti-phase mode.

2. An RF coil system as claimed in claim 1, wherein the main coil has a loop comprising a first and a second electrical conductor extending mainly parallel to the main coil axis, the RF coil system having a first and a second auxiliary coil assigned to said first conductor and arranged on opposite sides of said first conductor and a third and a fourth auxiliary coil assigned to said second conductor and arranged on opposite sides of said second conductor, each auxiliary coil having a coil axis extending substantially parallel to the main coil axis at a distance from the respective conductor of the main coil to which the respective auxiliary coil is assigned, wherein said distance is small relative to said main dimension.

3. An RF coil system as claimed in claim 2, wherein the first and the second conductor of the main coil extend substantially parallel to the main coil axis, and each auxiliary coil comprises two conductors extending substantially parallel to the main coil axis, wherein a distance B between the two conductors of each auxiliary coil is larger than 0,06*L and smaller than 0,25*L, L being a distance between the first and the second conductor of the main coil.

4. An RF coil system as claimed in claim 2, wherein the RF coil system comprises a skin contact surface, the first and the second conductor of the main coil extending in an imaginary plane at a distance D from said skin contact surface, and each auxiliary coil extending in an imaginary plane at a distance H from said skin contact surface, wherein $0<H<3*D$.

5. An RF coil system as claimed in claim 4, wherein $D<H<1,5*D$.

6. An RF coil system as claimed in claim 1, wherein the conductor of the main coil extends substantially parallel to the main coil axis, and each auxiliary coil comprises two conductors extending substantially parallel to the main coil axis, wherein the distance between the coil axis of each auxiliary coil and the conductor of the main coil is larger than 0,5*B and smaller than 1,5*B, B being a distance between the two conductors of the respective auxiliary coil.

7. A magnetic resonance imaging system comprising an examination volume, a main magnet system for generating a main magnetic field in the examination volume, a gradient magnet system for generating gradients of the main magnetic field, and an RF coil system for transmitting an RF magnetic field into the examination volume and/or receiving an RF magnetic field from the examination volume, wherein the RF coil system is an RF coil system as claimed in claim 1.

* * * * *